(12) United States Patent
Chikaki

(10) Patent No.: US 8,052,036 B2
(45) Date of Patent: Nov. 8, 2011

(54) TAB LEAD SOLDERING APPARATUS AND TAB LEAD SOLDERING METHOD

(75) Inventor: Yoshiro Chikaki, Tokyo (JP)

(73) Assignee: NPC Incorporated, Tokyo (JP)

( * ) Notice: Subject to any disclaimer, the term of this patent is extended or adjusted under 35 U.S.C. 154(b) by 0 days.

(21) Appl. No.: 11/892,723

(22) Filed: Aug. 27, 2007

(65) Prior Publication Data

US 2008/0048007 A1 Feb. 28, 2008

(30) Foreign Application Priority Data

Aug. 28, 2006 (JP) ................. 2006-230783

(51) Int. Cl.
*B23K 20/02* (2006.01)

(52) U.S. Cl. ..... 228/228; 228/193; 156/580; 156/583.2; 156/583.4; 156/583.91

(58) Field of Classification Search .......... 156/580, 156/583.2, 583.4, 583.91; 228/228, 193
See application file for complete search history.

(56) References Cited

U.S. PATENT DOCUMENTS 4,685,608 A 8/1987 Kujas

FOREIGN PATENT DOCUMENTS

| DE | 29805805 U1 * | 7/1998 |
|---|---|---|
| JP | 2004-111464 A | 4/2004 |
| JP | 2005-236235 A | 9/2005 |
| JP | 2006-066570 A | 3/2006 |
| WO | WO-2005/117140 A1 | 12/2005 |

OTHER PUBLICATIONS

Extended European Search Report, App. No. 07016831.5-1262, Jan. 25, 2010 (5 pages).
JPO Notification of Reason for Rejection, App. No. 2006-230783, Dispatch Date: Mar. 8, 2011, Dispatch No. 145832 (2 pages).

* cited by examiner

*Primary Examiner* — Jessica L Ward
*Assistant Examiner* — Erin Saad
(74) *Attorney, Agent, or Firm* — Rader, Fishman & Grauer PLLC

(57) ABSTRACT

A tab lead soldering apparatus soldering a tab lead to a front face and a rear face of a solar cell has a first pressing mechanism pressing the tab lead toward the front face of the solar cell, a second pressing mechanism pressing the tab lead toward the rear face of the solar cell rear face, a heat member and a support member provided to the first pressing mechanism and/or the second pressing mechanism to contact with the tab lead, a heat member shift mechanism shifting the heat member between a contact position to contact an end of the heat member with the tab lead and a separation position to separate the end of the heat member from the tab lead, and a support member shift mechanism shifting the support member between a contact position to contact an end of the support member with the tab lead and a separation position to separate the end of the support member from the tab lead.

2 Claims, 11 Drawing Sheets

TAB LEAD SOLDERING APPARATUS AND TAB LEAD SOLDERING METHOD

BACKGROUND OF THE INVENTION

1. Field of the Invention

The present invention relates to an apparatus and a method for soldering a tab lead to a solar cell in a solar battery manufacturing process.

2. Description of the Related Art

Conventionally, a solar cell module formed by arranging solar cells in a form of matrix, which convert solar energy into electrical energy, is known. This solar cell module is manufactured by a step of forming strings by arranging solar cells, which are in approximately square thin plate shape, in a line and electrically connecting adjacent solar cells, a step of forming a matrix by arranging the strings in parallel and electrically connecting the strings, and a step of covering the front face (light-receiving face) of the matrix with a cover glass and laminating the rear face of the matrix with a protection material (laminate material).

In the step of forming strings, long tape-like tab leads are connected to front face electrodes and rear face electrodes of the solar cells by soldering. In other words, the tab leads are connected to two adjacent solar cells. A half portion of the tab lead is soldered to the front face electrode of a prior solar cell and a rear half portion of the tab lead is soldered to the rear face electrode of a subsequent solar cell. A predetermined number of solar cells are connected linearly in this way to form a string.

Regarding such forming of strings, the applicant has disclosed Japanese Patent Application Laid-Open No. 2005-236235. According to a soldering method disclosed in the publication, a tab lead is heated as being pressed toward a front face and a rear face of a solar cell so that the tab lead is surely heated and melted for soldering.

SUMMARY OF THE INVENTION

According to the soldering method disclosed in Japanese Patent Application Laid-Open No. 2005-236235, efficient manufacturing can be performed by simultaneously soldering tab leads to the front and rear faces of the solar cell; however, it is difficult to maintain the temperature conditions of the front and rear faces of the solar cell to be the same when the tab leads are simultaneously soldered. Thus, temperature on the front face of the solar cell and temperature on the rear face of the solar cell differ in some cases. When such a difference in temperate on the front and rear faces of the solar cell occurs, a deformation of the solar cell is generated and this courses a soldering failure. Further, a fracture of the cell may occur due to heat stress generated in the solar cell.

In case that the tab lead is heated as being pressed by an abut member, since the tab lead is pulled by the abut member when separating the abut member from the tab lead, a positional displacement of the tab lead may occur. Further, in case that the tab lead is pulled by the abut member, the connecting strength of the soldering between the tab leads and the front and rear faces of the solar cell may be weakened.

An object of the present invention is to provide an apparatus and a method, capable of maintain a same temperature condition on a front face and a rear face of a solar cell and surely soldering the tab lead to the solar cell without any positional displacements.

In order to solve the above problem, the present invention provides a tab lead soldering apparatus soldering a tab lead to a front face and a rear face of a solar cell, having a first pressing mechanism pressing the tab lead toward the front face of the solar cell, a second pressing mechanism pressing the tab lead toward the rear face of the solar cell rear face, a heat member and a support member provided to the first pressing mechanism and/or the second pressing mechanism to contact with the tab lead, a heat member shift mechanism shifting the heat member between a contact position to contact an end of the heat member with the tab lead and a separation position to separate the end of the heat member from the tab lead, and a support member shift mechanism shifting the support member between a contact position to contact an end of the support member with the tab lead and a separation position to separate the end of the support member from the tab lead.

The first pressing mechanism and/or the second pressing mechanism can have a plurality of heat members and support members and the heat members and support members can be arranged alternatively along a longitudinal direction of the tab lead. In this case, the support members are disposed at both ends in a tab lead's longitudinal direction.

The heat member may be a ceramic heater. With this, the tab lead is surely heated and melted for soldering.

A sensor for measuring temperature of the heat member can be provided. A controller for controlling heating temperature of the heat member based on the measured value of the sensor can also be provided.

Further, the present invention provides a tab lead soldering method for soldering a tab lead to a front face and a rear face of a solar cell, having steps of supporting and heating the tab lead with a heat member to solder the tab lead to the front face and the rear face of the solar cell, contacting a support member to the tab lead while supporting the tab lead with the heat member, separating the heat member from the tab lead while supporting the tab lead with the support member, and separating the support member from the tab lead.

According to the present invention, since the ends of the heat members contact with the tab leads on the front and rear faces of the solar cell, soldering is performed in the same condition on the front and rear faces of the solar cell. Further, since the tab leads can surely be pressed to the front face and the rear face of the solar cell, the tab leads are soldered to the solar cell surely and efficiently. Furthermore, since the heat members are separated from the tab lead as pressing the tab leads by the support members, the tab lead will not be pulled by the heat members when the heat members are separated from the tab lead. Accordingly, a positional displacement of the tab leads or a soldering failure to the front and rear faces of the solar cell can be prevented.

DETAILED DESCRIPTION OF THE INVENTION

Figure 1:
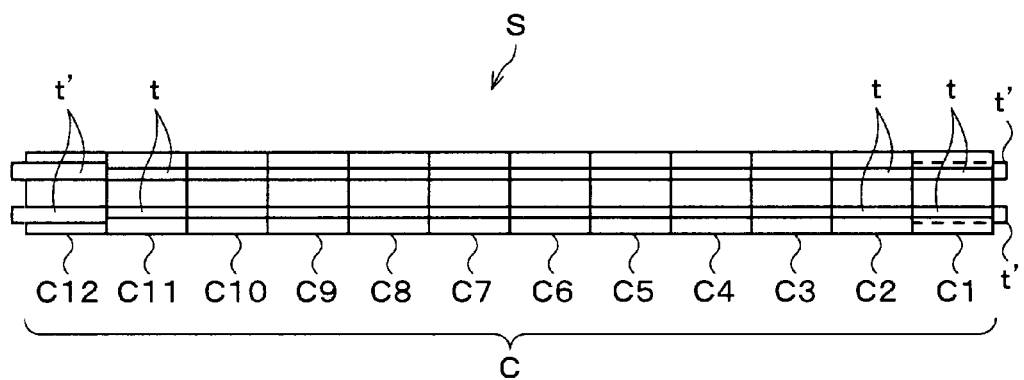
FIG. 1 is a plan view showing a string.
Figure 2:
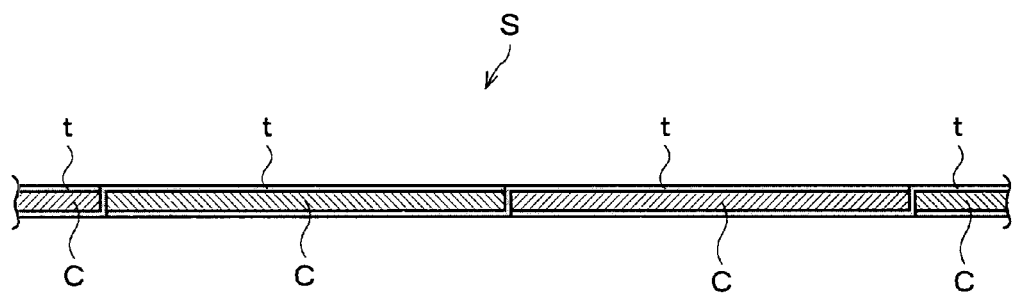
FIG. 2 is a sectional view showing a partially-enlarged string.

Preferred embodiments of the present invention will be described. As shown in FIG. 1, a string S is composed of solar cells C for converting solar energy into electrical energy and tab leads t. The plurality of solar cells C, for example, twelve solar cells C, are aligned in series and adjacent solar cells C are electrically connected with two tab leads t, which are arranged in parallel with a predetermined distance. The tab lead t is formed in a long tape-like shape with a predetermined width, for example, width of 2 mm, and the length of the tab lead t is almost equal to the double length of the solar cell C. When connecting adjacent solar cells C, as shown in FIG. 2, a front half portion of the tab lead t (the right portion in FIG. 2) is connected to a front face of the prior solar cell C (in the right side in FIG. 2) and a rear half portion of the tab lead t (the left portion in FIG. 2) is connected to a rear face of the subsequent solar cell C (in the left side in FIG. 2).

For purposes of illustration, among the twelve solar cells C in FIG. 1, the cell in the front (in the right side in FIG. 1) is referred to as solar cell C1, the cell being adjacent behind (in the left side in FIG. 1) the front solar cell C1 is referred to as solar cell C2, and the following cells are referred to as solar cell C3, ..., solar cell C12 in order. Here, each of the solar cells C1 to C12 is formed in an approximately square thin plate shape and electrodes (not shown) are formed on the front and rear faces of the solar cells C1 to C12, respectively. When forming a string S, between the adjacent solar cells C, the electrodes on the front faces and the electrodes on the rear faces are respectively connected by the tab leads t, as shown in FIG. 2. That is, referring to FIG. 1, the front face electrode of the front solar cell C1 is connected to the rear face electrode of the next solar cell C2 with two tab leads t. Similarly, the front face electrode of the solar cell C2 is connected to the rear face electrode of the next solar cell C3, ..., and the front face electrode of the solar cell C11 is connected to the rear face electrode of the last solar cell C12 with two tab leads t.

Further, to the rear face electrode of the first solar cell C1 and the front face electrode of the last solar cell C12, two long tape-like tab leads t' having a predetermined width, for example, width of 5 mm, is soldered, respectively. The two tab leads t' are connected so as to slightly protrude from a front end of the first solar cell C1 and a rear end of the last solar cell C12.

Figure 3:
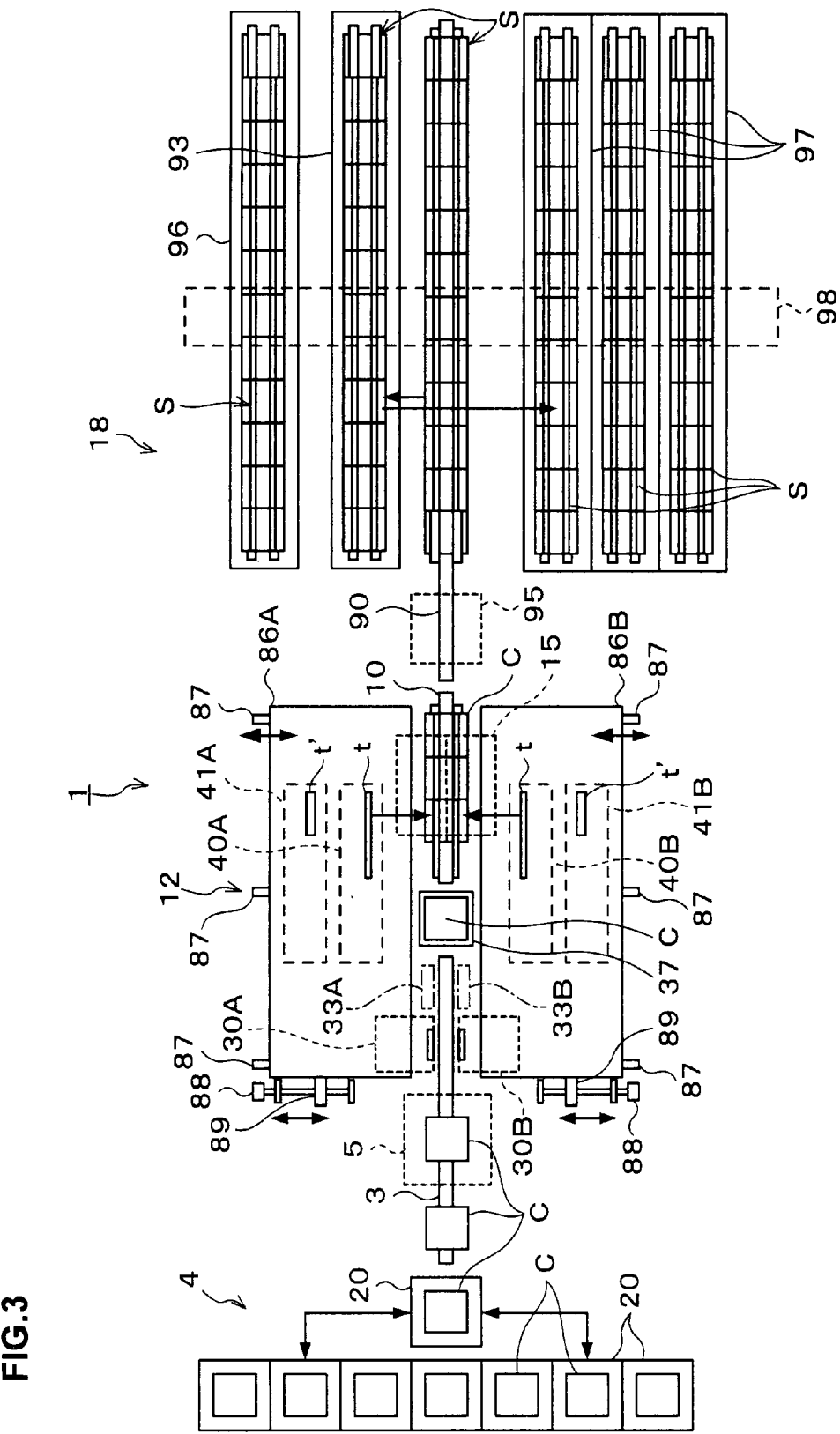
FIG. 3 is a schematic explanatory view showing a soldering apparatus according to the present embodiment.

FIG. 3 is a schematic plane view showing an entire soldering apparatus 1 according to the embodiment of the present invention. The soldering apparatus 1 includes a solar cell feeder 4 for feeing solar cells C to a conveyer 3 carrying the solar cells C toward a right direction in FIG. 3, a checking and positioning unit 5 for checking and positioning the solar cells C being carried by the conveyer 3, a conveyer 10 for carrying the solar cells C, which are carried by the conveyer 3 and checked by the checking and positioning unit 5, toward the right direction in FIG. 3, a tab lead feeder 12 for feeding tab leads t to the solar cells C on the conveyer 10, a soldering unit 15 for soldering the tab leads t to the solar cells C and a string transferring unit 18 for transferring strings S composed of a plurality of solar cells C, for example, twelve solar cells C, connected by the tab leads t.

Figure 4:
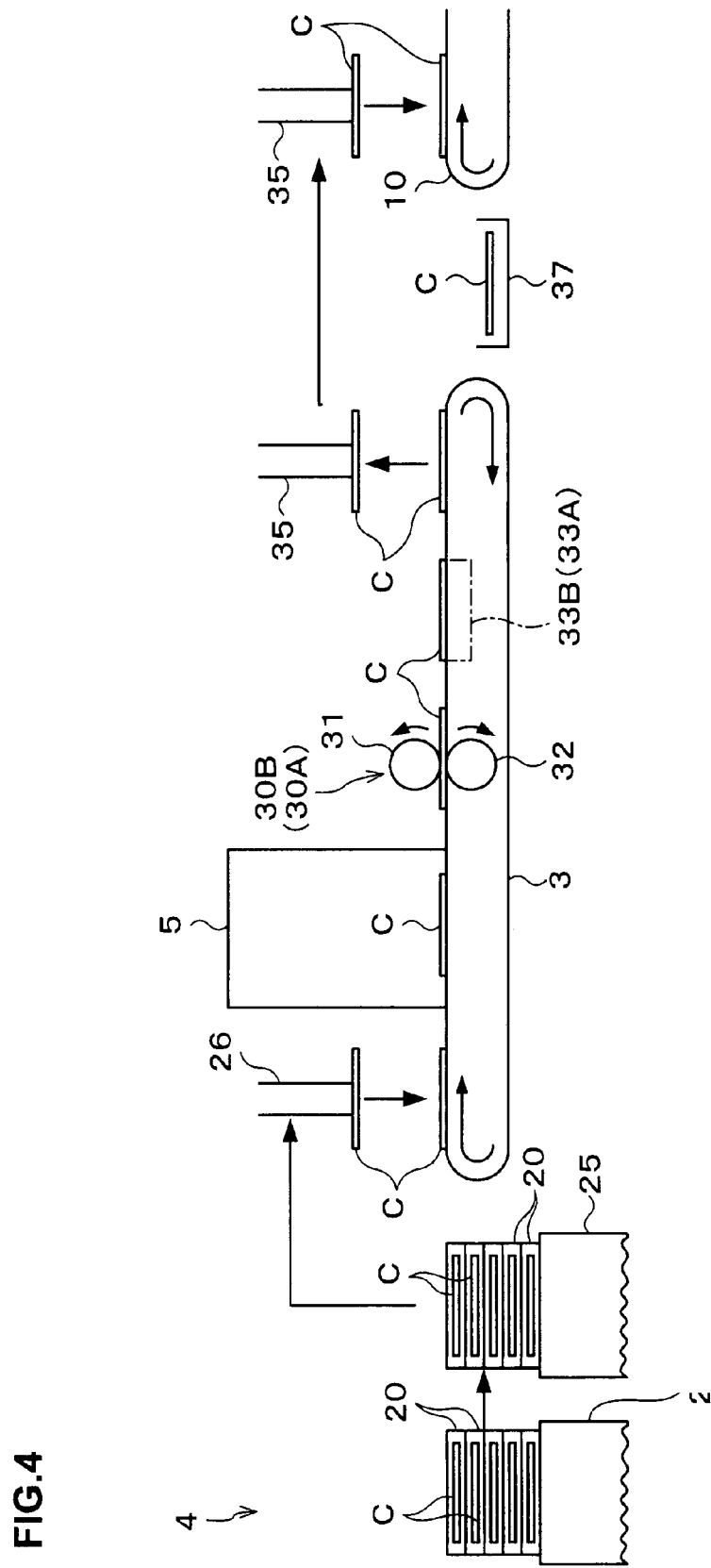
FIG. 4 is a schematic explanatory view showing a partially-enlarged soldering apparatus.

As shown in FIG. 4, the solar cell feeder 4 includes a container mounting table 21 for mounting a tray-like container 20 and each of the container contains a single solar cell C. In the container mounting table 21, a plurality of containers 20, for example, five containers 20, are mounted as being stacked one another. As shown in FIG. 3, sets of the stacked containers 20 are aligned on the container mounting table 21. Further, the solar cell feeder 4 has a container transfer mechanism (not shown) for transferring the sets of stacked containers 20 from the container mounting table 21 to a waiting table 25 one by one. Further, as shown in FIG. 4, a solar cell transfer mechanism 26 for taking a solar cell C from above the container 20 mounted on the waiting table 25 and transferring the solar cell C to the conveyer 3. The solar cell transfer mechanism 26 takes the solar cell C by sucking and holding the front face of the solar cell C. Furthermore, a container carry-out mechanism (not shown) for carrying the container 20, from which the solar cell C is already taken, from the waiting table.

The conveyer 3 is intermittently rotated clockwise in FIG. 4 by a motor (not shown). With this structure, the solar cell C on the conveyer 3 is intermittently moved to the right in FIGS. 3 and 4. The width of the conveyer 3 is made narrower than the distance between the tab leads t, t, which are attached to the rear face of the solar cell C. In other words, the solar cell C is supported by the conveyer 3 by contacting with the conveyer 3 at its inner portion of the rear face, which is between the positions where the two tab leads t, t are attached to. On a front face of the conveyer 3, a number of suction ports (not shown) are provided to suck air through the suction ports by a pressure reduction of an air supply chamber provided in the conveyer 3 so that the center of the rear face of the solar cell C is attached to the conveyer 3.

The checking and positioning unit 5 detects, for example, defects such as a fracture or a crack in an outer periphery of the solar cell C and a horizontal displacement of the solar cell C to correct the posture of the solar cell C to a predetermined direction.

As shown in FIG. 3, at the downstream of the checking and positioning unit 5 (in the right side in FIG. 3), flux apply mechanisms 30A, 30B for applying flux to the front and rear faces of the solar cells C are provided in the left side (in the upper side in FIG. 3) and the left side (in the lower side in FIG. 3) of the of the conveyer 3. As shown in FIG. 4, the flux apply mechanisms 30A, 30B has a front face applying roller 31 for contacting with the front face of the solar cells C and a rear face applying roller 32 for contacting with the rear face of the solar cells C. Each of the front face applying roller 31 and the rear face applying roller 32 rotates about a rotation center axis, which are horizontally provided and parallel to each other within a vertical plane. The bottom of the front face applying roller 31 and the top of the rear face applying roller 32 are provided close to each other, as facing to each other and sandwiching the solar cell C placed on the conveyer. Further, a flux feeder (not shown) is provided to supply flux to peripheral surfaces of the front face applying roller 31 and the rear face applying roller 32. When the front face applying roller 31 and the rear face applying roller 32 rotate, the peripheral surfaces of the front face applying roller 31 and the rear face applying roller 32 pass through the flux feeder (not shown) so that flux is applied to the peripheral surfaces. When the solar cell C passes through as being sandwiched between the front face applying roller 31 and the rear face applying roller 32, the front face applying roller 31 and the rear face applying roller 32 rotate and flux attached to the peripheral surfaces of the front face applying roller 31 and the rear face applying roller 32 are transferred to the front and rear faces of the solar cell C.

Between the conveyer 3 and the conveyer 10, a solar cell transfer mechanism 35 is provided to transfer the solar cells C carried to a terminal end of the conveyer 3 to the conveyer 10. Here, as illustrated with chained lines in FIGS. 3 and 4, at the terminal end of the conveyer 3, preliminary heaters 33A, 33B can be provided as preheaters for heating the solar cells C. The preliminary heaters 33A, 33B will be described later. The solar cell transfer mechanism 35 sucks and holds the front face of the solar cell C. Between the conveyer 3 and the conveyer 10, a solar cell collecting tray 37 is disposed for collecting solar cells C, which have some defects detected by the checking and positioning unit 5.

Figure 5:
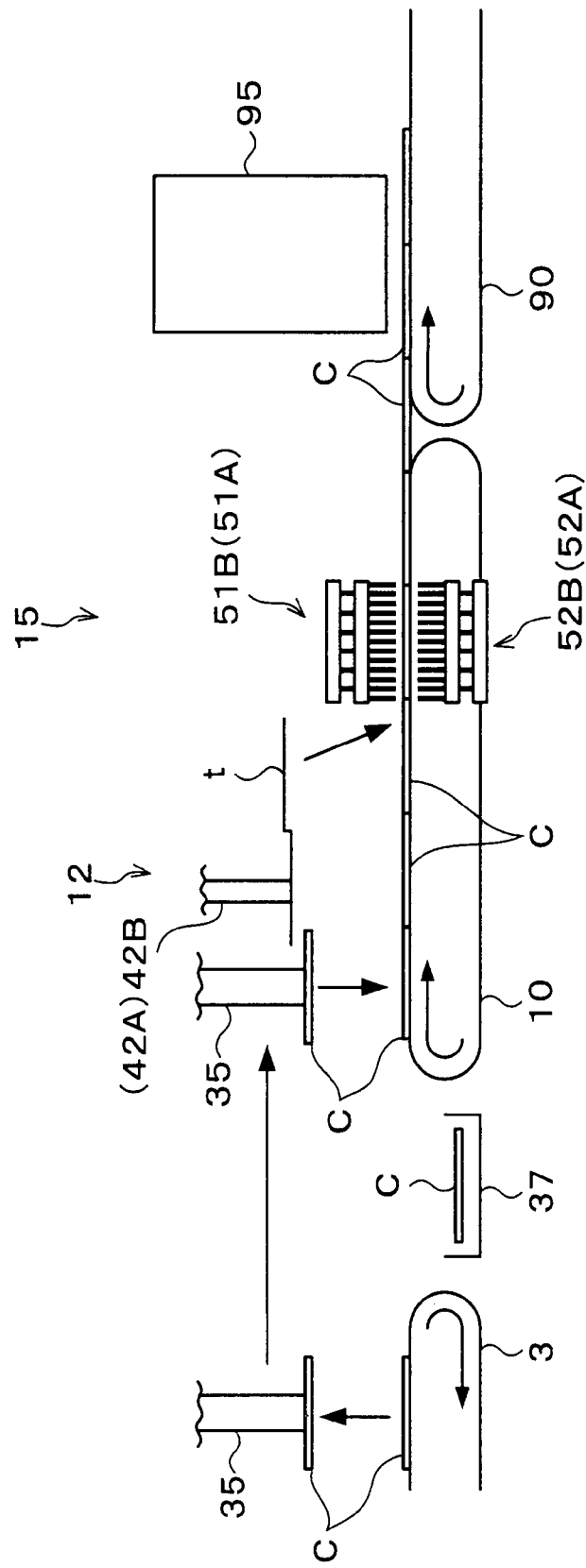
FIG. 5 is a schematic explanatory view showing a partially-enlarged soldering apparatus.

The conveyer 10 is intermittently rotated clockwise in FIG. 5 by a motor (not shown). With this structure, the solar cell C placed on the conveyer 10 is intermittently moved to the right in FIG. 5. The width of the conveyer 10 is made narrower than the distance between the tab leads t, t, which are attached to the rear face of the solar cell C. In other words, the solar cell C is supported by the conveyer 10 by contacting with the conveyer 10 at its inner portion of the rear face, which is between the positions where the two tab leads t, t are attached to. On a front face of the conveyer 10, a number of suction ports (not shown) are provided to suck air through the suction ports by a pressure reduction of an air supply chamber provided in the conveyer 10 so that the center of the rear face of the solar cell C is attached to the conveyer 10.

As shown in FIG. 3, the tab lead feeder 12 has 2 mm tab lead feeding units 40A, 40B for supplying 2 mm width tab leads t and 5 mm tab lead feeding units 41A, 41B for supplying 5 mm tab leads t. The 2 mm tab lead feeding unit 40A and the 5 mm tab lead feeding unit 41A are disposed in the left side (in the upper side in FIG. 3) of the conveyer 10 as facing to the conveying direction and the 2 mm tab lead feeding unit 40B and the 5 mm tab lead feeding unit 41B are disposed in the right side (in the lower side in FIG. 3) of the conveyer 10 as facing to the conveying direction. Further, as shown in FIG. 5, tab lead transfer mechanisms 42A, 42B are provided for transferring the tab leads t from the 2 mm tab lead feeding units 40A, 40B and the 5 mm tab lead feeding units 41A, 41B to the front face of the solar cell C on the conveyer 10. The tab lead transfer mechanism 42A is disposed in an upper left portion as facing to the conveying direction of the conveyer 10 and the tab lead transfer mechanism 42B is disposed in an upper right portion as facing to the conveying direction of the conveyer 10. The tab lead transfer mechanisms 42A, 42B suck and hold the upper face of the tab lead t. The 2 mm tab lead feeding units 40A, 40B have an almost symmetrical structure with respect to the conveyer 10. Similarly, the 5 mm tab lead feeding units 41A, 41B have an almost symmetrical structure with respect to the conveyer 10. The structures of the tab lead transfer mechanisms 42A, 42B are also symmetrical to each other with respect to the conveyer 10.

Each of the 2 mm tab lead feeding units 40A, 40B includes a roll, around which 2 mm tab lead t is coiled, a tab lead hold mechanism for drawing the tab lead t from the roll and a cutter for cutting the tab lead t drawn from the roll. Here, the roll, the tab lead hold mechanism and the cutter are not shown in the drawings. The tab lead t coiled around the roll is drawn by the tab lead hold mechanism, cut into a predetermined length by the cutter, and folded to generate a corner in its center portion. Then, the tab lead is transferred from the tab lead hold mechanism to the tab lead transferring unit and is provide to the front face of the solar cell C on the conveyer.

Similarly, each of the 5 mm tab lead feeding units 41A, 41B include a roll, around which 5 mm tab lead t' is coiled, a tab lead hold mechanism for drawing the tab lead t' from the roll and a cutter for cutting the tab lead t' drawn from the roll. Here, the roll, the tab lead hold mechanism and the cutter are not shown in the drawings. The tab lead t' coiled around the roll is drawn by the tab lead hold mechanism, cut into a predetermined length by the cutter, and transferred from the lead hold mechanism to the tab lead transferring unit to be supplied to a predetermined position.

Here, the length of the tab leads t, t' can be adjusted according to the size of the solar cell C. That is, the length of the tab leads t, t' drawing from the rolls (not shown) is adjusted to cut and this allows to supply tab leads t, t' in a preferred length. The length of the tab lead t is preferably, twice the length of the right and left sides of the solar cell C. The length of the tab lead t' is preferably slightly longer than the right and left sides of the solar cell C.

As shown in FIG. 5, the soldering unit 15 includes upper pressing mechanisms (first pressing mechanism) 51A, 51B for pressing the tab leads t toward the front face of the solar cell C and lower pressing mechanisms (second pressing mechanism) 52A, 52B for pressing the tab leads t toward the rear face of the solar cell C. The upper pressing mechanism 51A is disposed in an upper left portion as facing to the conveying direction of the conveyer 10 and the upper pressing mechanism 51B is disposed in an upper right portion as facing to the conveying direction of the conveyer 10. The upper pressing mechanisms 51A, 51B press the tab leads t on the front face of the solar cell C from above. The lower pressing mechanism 52A is disposed in a lower left portion as facing to the conveying direction of the conveyer 10 and the lower pressing mechanism 52B is disposed in a lower right portion as facing to the conveying direction of the conveyer 10. The lower pressing mechanisms 52A, 52B press the tab leads t on the rear face of the solar cell C from under the tab leads t.

Figure 6:
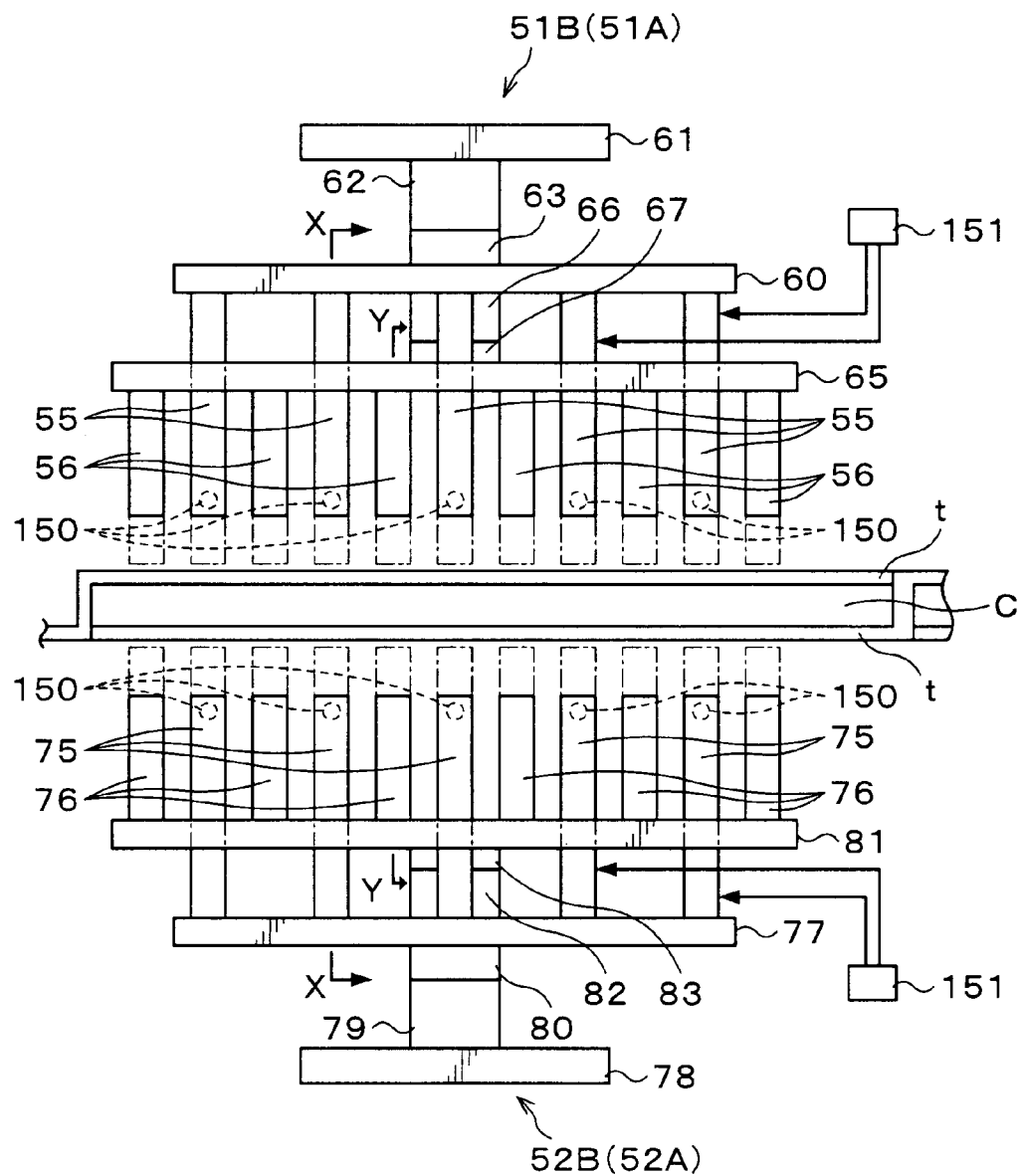
FIG. 6 is a schematic side view showing an upper pressing mechanism and a lower pressing mechanism.

As shown in FIG. 6, the upper pressing mechanism 51B has a plurality of heat members 55 and a plurality of support members 56. The heat members 55 and the support members 56 are formed in substantially column-shape and the length of the heat members 55 is made longer than the length of the support members 56. Further, the heat members 55 and the support members 56 are disposed in series along a longitudinal direction of the tab lead t supplied on the front face of the solar cell C and the heat members 55 and the support members 56 are aligned alternatively. In the illustrated example, the support members 56 are disposed at both ends in a tab lead's longitudinal direction. Thus, the number of the additional support members 56 is greater than the number of the number of the heat members 55 by one.

The continuous lines in FIG. 6 indicate the heat members 55 and the support members 56 of the upper pressing mechanism 51B, which are lofted. When the heat members 55 and the support members 56 are lifted, ends (bottom) of the heat members 55 and ends (bottom) of the support members 56 are in the same level and the ends of the heat members 55 and the ends of the support members 56 are in a position upwardly away from the tab lead t provided on the front face of the solar cell C (separation position). In this case, the ends of the heat members 55 and the ends of the support members 56 of the upper pressing mechanism 51B are disposed above the tab lead t supplied on the right side of the front face of the solar cell C as facing to the conveying direction of the conveyer 10.

The heat members 55 are composed of, for example, stainless-steel cartridge heaters. The heat members 55 can be composed of, for example, ceramic heaters.

Figure 7:
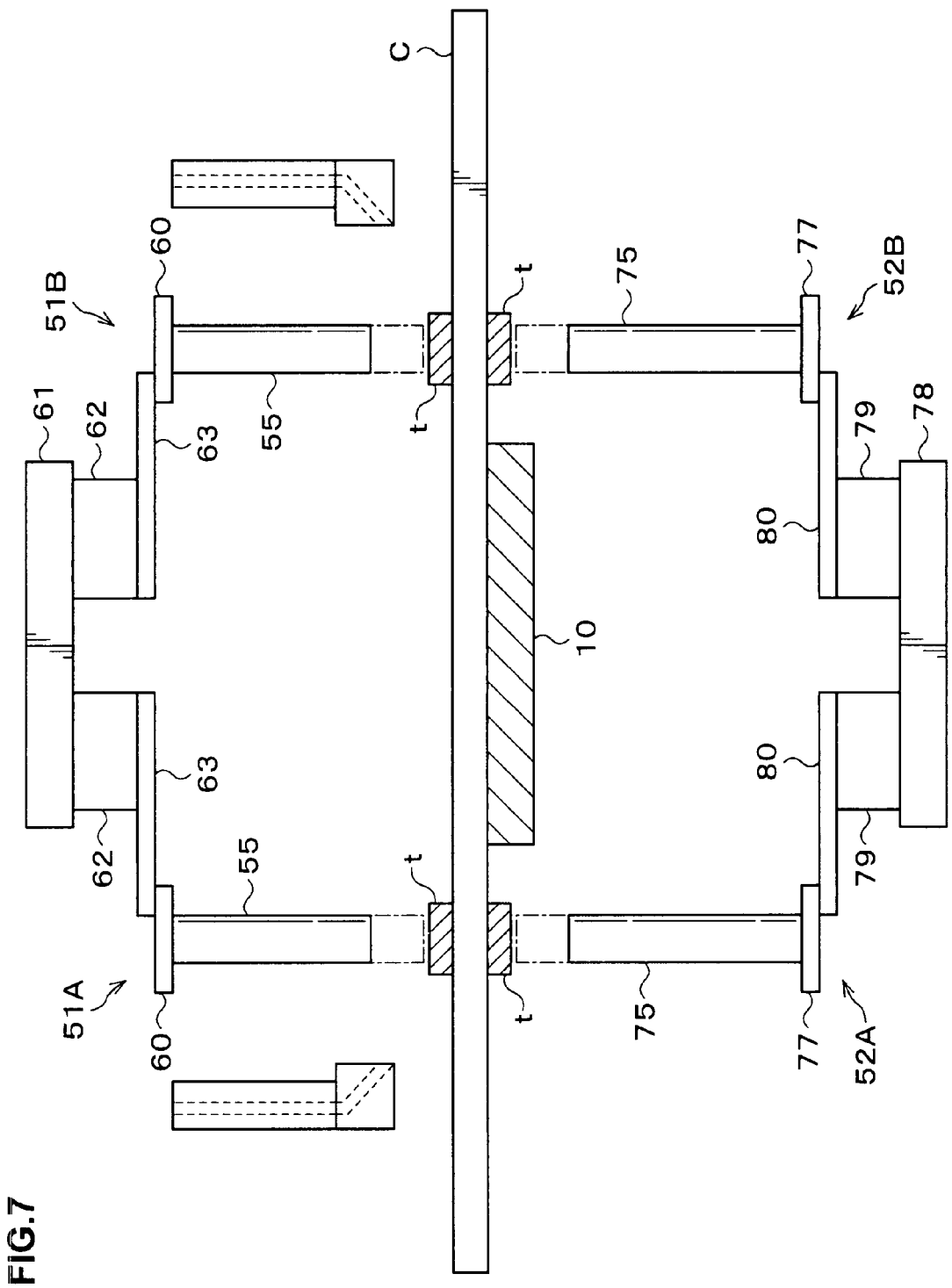
FIG. 7 is a schematic front view showing the upper pressing mechanism and the lower pressing mechanism, as seen from a position X in FIG. 6.

As shown in FIGS. 6 and 7, in the upper pressing mechanism 51B, base ends (upper ends) of the heat members 55 are fixed to a lifting and lowering plate 60. The lifting and lowering plate 60 is supported, via arms 63, by a heat member shift mechanism 62, which is provided to an upper supporting plate 61. As the heat member shift mechanism 62, for example, a cylinder device or a lifting and lowering device driven by a motor is employed. When the heat member shift mechanism 62 operates, the lifting and lowering plates 60 is lifted and lowered and the plurality of heat members 55 are lifted and lowered together. Accordingly, the heat members 55 are shifted between a lifted position (separation position) indicated by the continuous lines in FIGS. 6 and 7, where the ends of the heat members 55 are lifted above the solar cell C and a pressing position (contact position) indicated by the chained lines in FIGS. 6 and 7, where the ends of the heat members 55 contact with the tab lead t supplied on the front face of the solar cell C to support from above.

Figure 8:
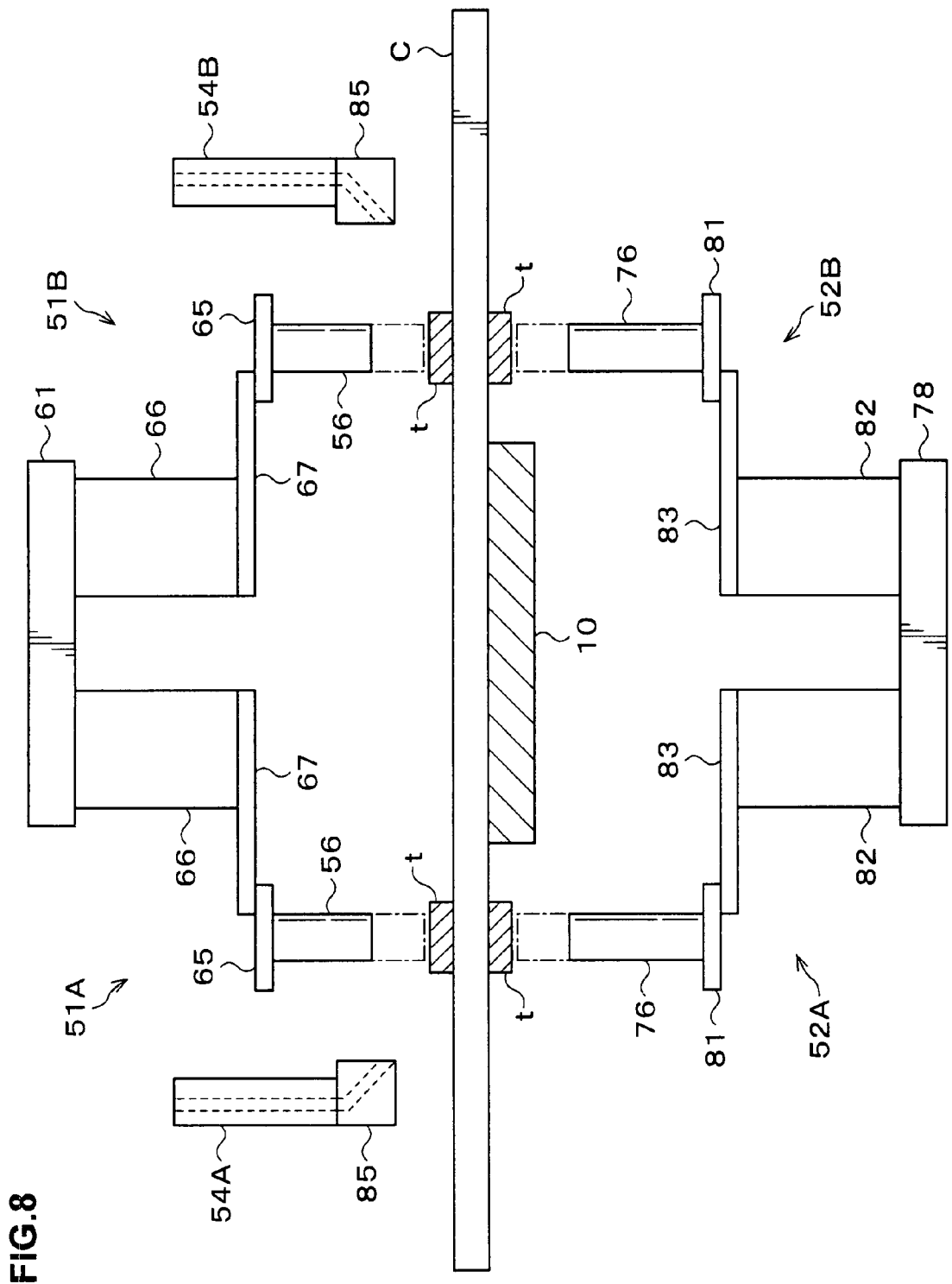
FIG. 8 is a schematic front view showing the upper pressing mechanism and the lower pressing mechanism, as seen from a position Y in FIG. 6.

Further, as shown in FIGS. 6 and 8, in the upper pressing mechanism 51B, all of base ends (upper ends) of the plurality of support members 56 are fixed to a lifting and lowering plate 65. The support members 56 are made of, for example, SUS. A lifting and lowering plate 65 fixing the support members 56 of the upper pressing mechanism 51B is disposed above the lifting and lowering plate 60 fixing the heat members 55. The lifting and lowering plate 65 is supported, via arms 67, by a support member shift mechanism 66, which is provided to the upper sup support member displacing mechanism porting plate 61. As the support member shift mechanism 66, also, a cylinder device or a lifting and lowering device driven by a motor is employed, for example. When the support member shift mechanism 66 operates, the lifting and lowering plate 65 is lifted and lowered and the plurality of support members 56 are lifted and lowered together. Accordingly, the support members 56 are shifted between a lifted position (separation position) indicated by the continuous lines in FIGS. 6 and 8, where the ends of the support members 56 are lifted above the solar cell C and a pressing position (contact position) indicated by the chained lines in FIGS. 6 and 8, where the ends of the support members 56 contact with the tab lead t supplied on the front face of the solar cell C to support from above.

Figure 9:
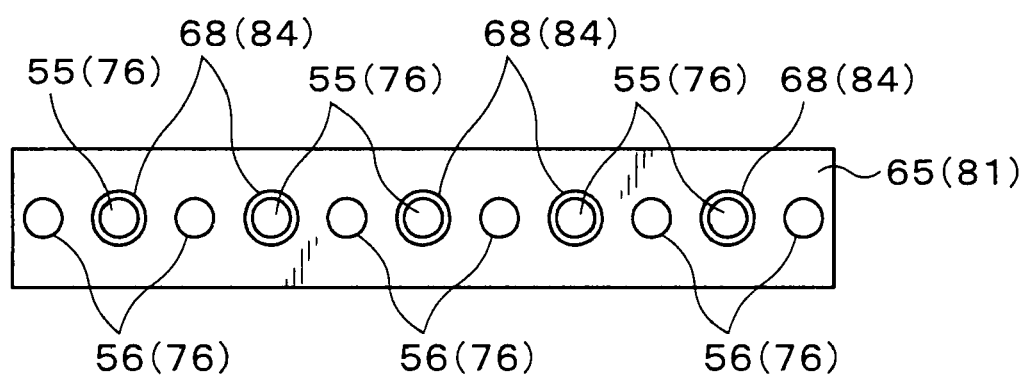
FIG. 9 is an explanatory view showing a lifting and lowering plate.

As shown in FIG. 9, through holes 68 passing the heat members 55 therethrough are provided, with preferable intervals, to the lifting and lowering plate 65 fixing the support members 56 of the upper pressing mechanism 51B. Accordingly, the heat members 55 can freely move up and down without being disturbed by the lifting and lowering plate 65.

Although the upper pressing mechanism 51B has been described, the upper pressing mechanism 51A has the same structure as the upper pressing mechanism 51B, so the same numerals are assigned to the same parts or sections in FIGS. 7 and 8 and the explanation of the upper pressing mechanism 51A is omitted here. The ends of the heat members 55 and the ends of the support members 56 of the upper pressing mechanism 51A are disposed above the tab lead t supplied on the left side of the front face of the solar cell C as facing to the conveying direction of the conveyer 10.

On the other hand, as shown in FIG. 6, the lower pressing mechanism 52B also has a plurality of heat members 75 and a plurality of support members 76. The heat members 75 and the support members 76 are formed in substantially column-shape and the length of the heat members 75 is made longer than the length of the support members 76. Further, the heat members 75 and the support members 76 are disposed in series along a longitudinal direction of the tab lead t supplied on the front face of the solar cell C and the heat members 75 and the support members 76 are aligned alternatively. In the illustrated example, the support members 76 are disposed at both ends in a tab lead's longitudinal direction. Thus, the number of the additional support members 76 is greater than the number of the number of the heat members 75 by one. Further, the heat members 75 and the support members 76 of the lower pressing mechanism 52B are arranged to correspond to the heat members 55 and the support members 56 of the upper pressing mechanism 51B. Accordingly, the heat members 75 of the lower pressing mechanism 52B are positioned under the heat members 55 of the upper pressing mechanism 51B and the support members 76 of the lower pressing mechanism 52B are positioned under the support members 56 of the upper pressing mechanism 51B.

The continuous lines in FIG. 6 indicate the heat members 75 and the support members 76 of the lower pressing mechanism 52B being lowered. When the heat members 75 and the support members 76 are lowered, ends (upper ends) of the heat members 75 and ends (upper ends) of the support members 76 are in the same level under the solar cell C and the ends of the heat members 75 and the ends of the support members 76 are in a position downwardly away from the tab lead t provided on the front face of the solar cell C (separation position). In this case, the ends of the heat members 75 and the ends of the support members 76 of the lower pressing mechanism 52B are disposed under the tab lead t supplied on the right side of the front face of the solar cell C as facing to the conveying direction of the conveyer 10.

The heat members 75 are also composed of, for example, a stainless-steel cartridge heaters. The heat member 75 can be composed of, for example, ceramic heaters.

As shown in FIGS. 6 and 7, in the lower pressing mechanism 52B, base ends (bottom ends) of the heat members 75 are fixed to a lifting and lowering plate 77. The lifting and lowering plate 77 is supported, via arms 80, by a heat member shift mechanism 79, which is provided to an lower supporting plate 78. As the heat member shift mechanism 79, for example, a cylinder device or a lifting and lowering device driven by a motor is employed. When the heat member shift mechanism 79 operates, the lifting and lowering plate 77 is lifted and lowered and the plurality of heat members 75 are lifted and lowered together. Accordingly, the heat members 75 are shifted between a lowered position (separation position) indicated by the continuous lines in FIGS. 6 and 7, where the ends of the heat members 75 are lowered under the solar cell C and a pressing position (contact position) indicated by the chained lines in FIGS. 6 and 7, where the ends of the heat members 75 contact with the tab lead t supplied on the front face of the solar cell C to support from beneath.

Further, as shown in FIGS. 6 and 8, in the lower pressing mechanism 52B, base ends (bottom ends) of the plurality of support members 76 are fixed to the lifting and lowering plate 81. The support members 76 are made of, for example, SUS. The lifting and lowering plate 81 fixing the support members 76 of the lower pressing mechanism 52B is disposed under the lifting and lowering plate 77 fixing the heat members 75. The lifting and lowering plate 81 is supported, via arms 83, by a support member shift mechanism 82, which is provided to the lower supporting plate 78. As the support member shift mechanism 82, also, for example, a cylinder device or a lifting and lowering device driven by a motor is employed. When the support member shift mechanism 82 operates, the lifting and lowering plate 81 is lifted and lowered and the plurality of support members 76 are lifted and lowered together. Accordingly, the support members 76 are shifted between a lowered position (separation position) indicated by the continuous lines in FIGS. 6 and 8, where the ends of the support members 76 are lowered under the solar cell C and a pressing position (contact position) indicated by the chained lines in FIGS. 6 and 8, where the ends of the support members 76 contact with the tab lead t supplied on the front face of the solar cell C to support from beneath.

Here, as shown in FIG. 9, through holes 84 passing the heat members 75 therethrough are provided, with preferable intervals, to the lifting and lowering plate 81 fixing the support members 76 of the lower pressing mechanism 52B. Accordingly, the heat members 75 can freely move up and down without being disturbed by the lifting and lowering plate 81.

Although the lower pressing mechanism 52B has been described, the lower pressing mechanism 52A has the same structure as the lower pressing mechanism 52B, so the same numerals are assigned to the same parts or sections in FIGS. 7 and 8 and the explanation of the lower pressing mechanism 52A is omitted here. The ends of the heat members 75 and the ends of the support members 76 of the lower pressing mechanism 52A are disposed under the tab lead t supplied on the left side of the front face of the solar cell C as facing to the conveying direction of the conveyer 10.

As shown in FIGS. 7 and 8, cooling mechanisms 54A, 54B for cooling the tab lead t are provided in an outer side of the upper pressing mechanisms 51A, 51B. The cooling mechanisms 54A, 54B include cool air supply nozzles 85 for supplying cool air to the tab lead t on the front face of the solar cell C.

In the left side as facing to the conveying direction of the conveyer 10, a movable table 86A for supporting the flux apply mechanism 30A, the 2 mm tab lead feeding unit 40A, the 5 mm tab lead feeding unit 41A, the upper pressing mechanism 51A, the lower pressing mechanism 52A and the cooling mechanism 54A is provided. In the right side as facing to the conveying direction of the conveyer 10, a movable table 86B for supporting the flux apply mechanism 30B, the 2 mm tab lead feeding unit 40B, the 5 mm tab lead feeding unit 41B, the upper pressing mechanism 51B, the lower pressing mechanism 52B and the cooling mechanism 54B is provided.

The movable table 86A is supported by a plurality of rails 87, which are arranged to be parallel to each other, and the movable table 86A can slide along each of the rails 87. The rails 87 extend vertically and horizontally with respect to the conveyers 3, 10 and fixed to the floor. In FIG. 3, the movable table 86A is supported by the rails 87 at its front edge (in the right side in FIG. 3), center portion, rear edge (in the left side in FIG. 3). Further, feed screws 88 for moving the movable table 86A along each of the rails 87 are provided. The feed screws 88 are engaged with female screw portions 89 provided to the movable table 86A and rotate about a center axis parallel to the rails 87. When the feed screws 88 are rotated, the movable table 86A slides along the rails 87 so that the flux apply mechanism 30A, the 2 mm tab lead feeding unit 40A, the 5 mm tab lead feeding unit 41A, the upper pressing mechanism 51A, the lower pressing mechanism 52A and the cooling mechanism 54A are moved to the right and left directions integrally with the movable table 86A. The movable table 86B has a structure symmetrical to the structure of the movable table 86A with respect to the conveyer 10. The movable table 86B is supported by a plurality of rails 87 and feed screws 88 for moving the movable table 86B are provided. With this structure, the movable table 86B also slides along the rails 87 and the flux apply mechanism 30B, the 2 mm tab lead feeding unit 40B, the 5 mm tab lead feeding unit 41B, the upper pressing mechanism 51B, the lower pressing mechanism 52B and the cooling mechanism 54B are moved to the right and left directions integrally with the movable table 86B.

The positions of the movable tables 86A, 86B are adjusted according to the position of tab leads t to be soldered to the solar cell C. For example, when the size of the solar cell C is small and the distance between the right and left tab leads t, t is also small, the movable tables 86A, 86B are placed to be close to the conveyer 10. When the size of the solar cell C is large and the distance between the right and left tab leads t, t is also large, the movable tables 86A, 86B are placed away from the conveyer 10. Adjusting the positions of the movable tables 86A, 86B in this way, the flux apply mechanisms 30A, 30B, the 2 mm tab lead feeding units 40A, 40B, the 5 mm tab lead feeding units 41A, 41B, the upper pressing mechanisms 51A, 51B, the lower pressing mechanisms 52A, 52B and the cooling mechanisms 54A, 54B can easily be moved to a position for soldering tab leads t. The positions of the movable tables 86A, 86B can be adjusted easily and with a high degree of accuracy by adjusting the rotation angles of each feed screws 88.

In the string transferring unit 18, a conveyer 90 is provided for transferring the solar cells C (combined solar cells C) sequentially combined with the tab leads t by the soldering unit 15 toward the right direction in FIG. 3. After passing through a terminal end of the conveyer 10, the combined solar cells C is moved horizontally and transferred to a start end of the conveyer 90. The conveyer 90 is intermittently rotated clockwise in FIG. 5 by a motor (not shown). With this structure, the solar cell C on the conveyer 90 is intermittently moved to the right in FIG. 5. On a front face of the conveyer 90, a number of suction ports (not shown) are provided to suck air through the suction ports by a pressure reduction of an air supply chamber provided in the conveyer 90 so that the rear face of the solar cell C is attached to the conveyer 90.

Further, the string transferring unit 18 includes a string inversion mechanism (not shown) for taking up a completed string S, in which twelve solar cells C are connected with the tab leads t, from the conveyer 90 to inverse and an inverted string mounting table 93 for mounting the inverted strings S. Further, a checking unit 95 for checking the combined solar cells C a defective string collecting tray 96 for collecting string S including detected defects and a string container 97 for containing fine strings S are provided. Further, a transfer mechanism 98 for transferring the strings S from the inverted string mounting table 93 to the defective string collecting tray 96 or the string container 97.

The checking unit 95 is disposed above the conveyer 90 and checks the strings S while the strings S are moved by the conveyer 90. The string inversion mechanism (not shown) sucks the front face of the string S with a plurality of suction members to hold, inverts the suction members and the string S integrally, and stops sucking on the inverted string mounting table 93. The string S is transferred to the defective string collecting tray 96 or the string container 97 based on the checking result of the checking unit 95. The transfer mechanism 98 sucks the front face of the string S with a plurality of suction members (not shown) to hold and transfer. A plurality of string containers 97 can be arranged in parallel. In the string container 97, a predetermined number of strings S, for example, about ten strings S, are stacked in a condition that its rear faces of the solar cells C face upward and its front faces face downward.

In the soldering apparatus 1 having the structure described above, firstly, the containers 20 containing the solar cells C are stacked on the container mounting table 21. The solar cells C are disposed in the container 20 in a manner that their front faces face upward and rear face faces face downward. Then, the container transfer mechanism (not shown) transfers the container 20 to the waiting table 25 and the solar cell transfer mechanism 26 sucks and holds the solar cell C from the container 20 on the waiting table 25 to transfer to the start end of the conveyer 3. The solar cell C is disposed on the conveyer 3 in a manner that its front face faces upward and rear face faces downward. The solar cell C is disposed on the later described conveyers 10, 90 in a manner that its front face faces upward and rear face faces downward.

The solar cell C disposed on the conveyer 3 is intermittently moved toward the terminal end of the conveyer 3 sequentially in order from the solar cell C1 to the solar cell C12 due to the intermittent rotation of the conveyer 3. While being on the conveyer 3, the solar cells C are sucked and held by the front face of the conveyer 3. After transferred on the conveyer 3, the solar cell C firstly passes though the checking and positioning unit 5. The checking and positioning unit 5 checks whether or not there is any defect in the solar cell C such as a fracture or a crack, and determines the position of the solar cell C.

Next, the flux apply mechanisms 30A, 30B apply flux to the front and rear faces of the solar cell C. The solar cell C passes through between the front face applying roller 31 of the flux apply mechanism 30A and the rear face applying roller 32 of the flux apply mechanism 30B. With this, flux is applied from the peripheral surfaces of the front face applying roller 31 and the rear face applying roller 32 of the flux apply mechanisms 30A, 30B to the front face and rear face of the solar cell C. Here, the positions of the front face applying roller 31 and the rear face applying roller 32 of the flux apply mechanisms 30A, 30B are adjusted in advance according to the position of the tab lead t to be soldered by moving the movable tables 86A, 86B so that the flux is applied to tab lead t soldering position.

As described above, while the solar cell C is carried by the conveyer 3, checking, positioning and flux applying is perfumed on the solar cell C. Then, the solar cell transfer mechanism 35 takes up the solar cell C from the terminal end of the conveyer 3 and transfers to the start end of the conveyer 10 or the solar cell collecting tray 37. Here, when a defect is found in the check result of the checking and positioning unit 5, the solar cell C is transferred to the solar cell collecting tray 37. The solar cell C determined as a fine solar cell is transferred to the conveyer 10.

The solar cell C disposed on the conveyer 10 is moved intermittently toward the terminal end due to the intermittent rotation of the conveyer 10. In this case, also, the solar cell C is sucked and held to the conveyer 10 and moved intermittently toward the terminal end sequentially in order of from the solar cell C1 to the solar cell C12. Then, in the tab lead feeder 12, firstly, the 5 mm tab lead feeding units 41A, 41B cut a predetermined length of tab leads t', t' and the tab lead transferring units 42A, 42B in the right and left sides supply the tab leads t', t' to a predetermined position on both faces of the conveyer 10. At this time, since the heat members 55b and support members 56 of the upper pressing mechanisms 51A, 51B are lifted and the heat members 75 and support members 76 of the lower pressing mechanisms 52A, 52B are lowered, the heat members 55, support members 56, heat members 75 and support members 76 will not disturb the application of the tab leads t', t'.

Then, the first solar cell C1 placed on the conveyer 10 is firstly transferred and the tab leads t', t' are placed in right and left sides on the rear face of the solar cell C1. Here, the movement of the conveyer 10 is temporary stopped so that the solar cell C1 having the tab leads t', t' applied to its rear face is kept waiting.

Next, in the tab lead feeder 12, the 2 mm tab lead feeding units 40A, 40B cut the tab leads t, t in a predetermined length and the tab lead transferring units 42A, 42B suck and hold the rear portions of the tab leads t, t to transfer and supply the tab leads t, t in a manner that the front portions of the tab leads t, t are close to the front face of the waiting solar cell C1. Then, the heat members 55 of the upper pressing mechanisms 51A, 51B are lowered to lower the ends of the heat members 55 to the contact position and the heat members 75 of the lower pressing mechanisms 52A, 52B are lifted to lift the ends of the heat members 75 to the contact position. Accordingly, the front half portions of the tab leads t, t supplied on the front face of the solar cell C1 are heated as being pressed toward the front face of the solar cell C1 by the heat members 55 so that the front half portions of the tab leads t, t are soldered on the front face of the solar cell C1. Further, the tab leads t', t' supplied on the rear face of the solar cell C1 are heated as being pressed toward the rear face of the solar cell C1 by the heat members 75 so that the tab leads t', t' are soldered on the rear face of the solar cell C1.

Next, the support members 56 of the upper pressing mechanisms 51A, 51B are lowered to lower the ends of the support members 56 to the contact position and the support members 76 of the lower pressing mechanisms 52A, 52B are lifted to lift the ends of the support members 76 to the contact position. With this, the front half portions of the tab leads t, t supplied on the front face of the solar cell C1 are pressed toward the front face of the solar cell C1 by the support members 56 together with the heat members 55 and the tab leads t', t' supplied to the rear face of the solar cell C1 are pressed toward the rear face of the solar cell C1 by the support members 76 together with the heat members 75. In this way, the tab leads t, t and the tab leads t', t' are surely held on the front and rear faces of the solar cell C1 to be soldered.

Here, when the support members 56 are placed to contact with the tab leads t, t and the support members 76 are placed to contact with the tab leads t', t', since heat is released via the support members 56 and support members 76, the tab leads t, t heated by the heat members 55 up to the solder melting temperature and the tab leads t', t' heated by the heat members 75 up to the solder melting temperature are cooled quickly. Accordingly, the melted solder is quickly solidified and the tab leads t, t and tab leads t', t' are surely soldered to the front and rear faces of the solar cell C1. Further, when the support members 56 are placed to contact with the tab leads t, t and support members 76 are placed to contact with the tab leads t', t' in this way, starting the cool air supply nozzles 85 of the cooling mechanisms 54A, 54B to blow cool air allows the tab leads t, t and tab leads t', t' are cooled more quickly. Accordingly, the melted solder is cooled more quickly and soldering of the tab leads t, t and tab leads t', t' are more ensured. Here, since the solar cell C is generally made of a material, which is good in heat conductance, such as silicon, blowing cool air to the front face of the solar cell C can also cool the rear face of the solar cell C.

In this way, after the tab leads t, t and tab leads t', t' are soldered to the front and rear faces of the solar cell C1, the heat members 55 of the upper pressing mechanisms 51A, 51B are lifted to the separation position to separate the ends of the heat members 55 from the tab leads t, t and the heat members 75 of the lower pressing mechanisms 52A, 52B are lowered to the separation position to separate the ends of the heat members 75 from the tab leads t', t'. Here, the heat members 55 can be lifted and the heat members 75 can be lowered at the same time contacting the support members 56 with the tab leads t, t and the support members 76 with the tab leads t', t'. Further, when the ends of the heat members 55 are separated from the tab leads t, t and the ends of the heat members 75 are separated from the tab leads t', t' in this way, the support members 56 are kept contacting with the tab leads t, t and the support members 76 are kept contacting with the tab leads t', t'. In this way, while the tab leads t, t and tab leads t', t' are supported by the support members 56 and the support members 76, the heat members 55 and the heat members 75 are separated from the tab leads t, t and tab leads t', t'. Accordingly, it is possible to prevent that the tab leads t, t and the tab leads t', t' are pulled by the heat members 55 and the heat members 75 when separating the heat members 55 and the heat members 75 from the tab leads t, t and the tab leads t', t'. As a result, positional displacements of the tab leads t, t and tab leads t', t' or a soldering failure can be prevented.

Further, when the heat members 55 and the heat members 75 are separated from the tab leads t, t and the tab leads t', t' as supporting the tab leads t, t and tab leads t', t' by the support members 56 and the support members 76, both ends of the tab leads t, t in a longitudinal direction are supported by the support members 56 and the both ends of the tab leads t', t' in a longitudinal direction are supported by the support members 76. Accordingly, even in the ends of the tab leads t, t and tab leads t', t' in the longitudinal direction where troubles such as solder separation often occurs, the tab leads t, t and the tab leads t', t' will not be pulled by the heat members 55 and the heat members 75 and soldering failures can be prevented.

After surely soldering the tab leads t, t and tab leads t', t' to the front and rear faces of the solar cell C1 as described above, the support members 56 of the upper pressing mechanisms 51A, 51B are lifted to the separation position to separate the ends of the support members 56 from the tab leads t, t and the support members 76 of the lower pressing mechanisms 52A, 52B are lowered to the separation position to separate the ends of the support members 76 from the tab leads t', t'.

Next, the solar cell transfer mechanism 35 takes up the solar cell C2 from the terminal end of the conveyer 3 and transfers on the conveyer 10. Here, the solar cell C2 is transferred to be adjacent to the rear side of the first solar cell C1 and the rear face of the solar cell C2 are disposed on the rear half portion of the two tab leads t, t soldered on the front face of the first solar cell C1. Then the front face of the conveyer 10 sucks and holds the solar cell C2.

The conveyer 10 restarts to rotate as sucking and holding the solar cells C1, C2 on its front face to move the solar cells C1, C2 by a length of the solar cell C1. Then the rotation of the conveyer 10 is temporary stopped.

In the tab lead feeder 12, the 2 mm tab lead feeding units 40A, 40B cut the tab leads t, t into a predetermined length. The tab lead transferring units 42A, 42B suck and hold the rear portions of the tab leads t, t to transfer and supply so that the front half portions of the tab leads t, t are on the waiting solar cell C2. Then the heat members 55 of the upper pressing mechanisms 51A, 51B are lowered to lower the ends of the heat members 55 to the contact position and the heat members 75 of the lower pressing mechanisms 52A, 52B are lifted to lift the ends of the heat members 75 to the contact position. With this, the front half portions of the tab leads t, t supplied on the front face of the solar cell C2 are heated as being pressed toward the front face of the solar cell C2 by the heat members 55, so the front half portions of the tab leads t, t are soldered to the front face of the solar cell C2. Further, the rear half portions of the tab leads t, t, whose front half portion is already attached on the front face of the first solar cell C1, are heated as being pressed toward the rear face of the solar cell C2 by the heat members 75 and the tab leads t, t are soldered to the rear face of the solar cell C2.

Next, the support members 56 of the upper pressing mechanisms 51A, 51B are lowered to lower the ends of the support members 56 to the contact position and the support members 76 of the lower pressing mechanisms 52A, 52B are lifted to lift the ends of the support members 76 to the contact position. With this, the front half portions of the tab leads t, t supplied on the front face of the solar cell C2 are pressed towered the front face of the solar cell C2 by the support members 56 together with the heat members 55 and the rear half portion of the tab leads t, t supplied on the rear face of the solar cell C2 are pressed toward the rear face of the solar cell C2 by the support members 76 together with the heat members 75. Accordingly, the tab leads t, t are soldered as being surely attached to the front and rear faces of the solar cell C2. As a result, the first solar cell C1 and the next solar cell C2 are connected with the two tab leads t, t.

When the support members 56 and the support members 76 are placed to contact with the tab leads t, t, since heat is released via the support members 56 and support members 76, the tab leads t, t heated by the heat members 55 and the heat members 75 up to the solder melting temperature are cooled quickly. Accordingly, the melted solder is quickly solidified and the tab leads t, t are surely soldered to the front and rear faces of the solar cell C2. Further, when the support members 56 and support members 76 are placed to contact with the tab leads t, t in this way, starting the cool air supply nozzles 85 of the cooling mechanisms 54A, 54B to blow cool air allows the tab leads t, t are cooled more quickly. Accordingly, the melted solder is cooled more quickly and soldering of the tab leads t, t are more ensured. Here, since the solar cell C is generally made of a material, which is good in heat conductance, such as silicon, blowing cool air to the front face of the solar cell C can also cool the rear face of the solar cell C.

In this way, after the tab leads t, t are soldered to the front and rear faces of the solar cell C2, the heat members 55 of the upper pressing mechanisms 51A, 51B are lifted to the separation position and the heat members 75 of the lower pressing mechanisms 52A, 52B are lowered to move the ends of the heat members 55 and the ends of heat members 75 to the separation position to separate from the tab leads t, t. Here, the heat members 55 can be lifted and the heat members 75 can be lowered at the same time with contacting the support members 56 and the support members 76 with the tab leads t, t. Further, when the ends of the heat members 55 and the ends of the heat members 75 are separated from the tab leads t, t in this way, the support members 56 and the support members 76 are kept contacting with the tab leads t, t. In this way, while the tab leads t, t are supported by the support members 56 and the support members 76, the heat members 55 and the heat members 75 are separated from the tab leads t, t. Accordingly, it is possible to prevent that the tab leads t, t are pulled by the heat members 55 and the heat members 75 when separating the heat members 55 and the heat members 75 from the tab leads t, t. As a result, positional displacements of the tab leads t, t or a soldering failure can be prevented.

Further, when the heat members 55 and the heat members 75 are separated from the tab leads t, t as supporting the tab leads t, t by the support members 56 and the support members 76, both ends of the tab leads t, t in a longitudinal direction are supported by the support members 56 and the support members 76. Accordingly, even in the ends of the tab leads t, t in the longitudinal direction where troubles such as solder separation often occur, the tab leads t, t will not be pulled by the heat members 55 and the heat members 75 and soldering failures can be prevented.

After surely soldering the tab leads t, t to the front and rear faces of the solar cell C2 as described above, the support members 56 of the upper pressing mechanisms 51A, 51B are lifted and the support members 76 of the lower pressing mechanisms 52A, 52B are lowered to move the ends of the support members 56 and the ends of the support members 7 to the separation positions to separate the from the tab leads t, t.

Next, the solar cell transfer mechanism 35 further takes up the another solar cell C3 from the terminal end of the conveyer 3 and transfers to the conveyer 10. Here, the solar cell C3 is transferred to be adjacent to the rear side of the first solar cell C2 and the rear face of the solar cell C3 are disposed on the rear half portion of the two tab leads t, t soldered on the front face of the first solar cell C2. Then, the front face of the conveyer 10 sucks and hold the solar cell C3.

The conveyer 10 restarts to rotate as sucking and holding the solar cells C1, C2, C3 on its front face to move the solar cells C1, C2, C3 by a length of the solar cell C1. Then the rotation of the conveyer 10 is temporary stopped.

Then, twelve solar cell C1 to C12 are soldered with tab leads t, t by repeating the same process of combining the solar cells C1, C2.

Figure 10A:
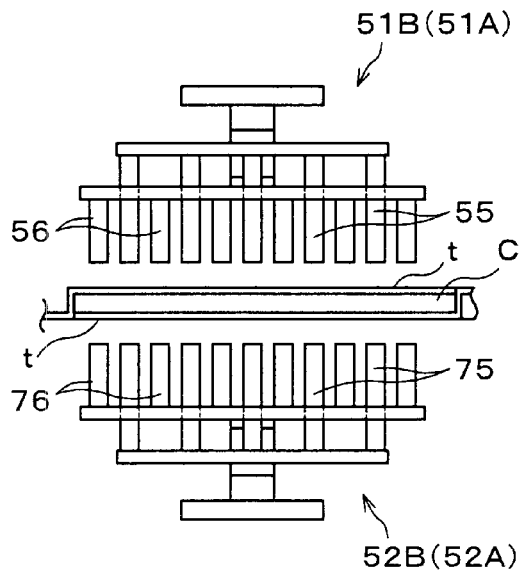
FIGS. 10A to 10D are explanatory views showing a process for soldering tab leads between solar cells.

The solar cells C1 to C12 are combined as shown in FIGS. 10A to 10D. Firstly, as shown in FIG. 10A, in a condition that the heat members 55 and the support members 56 of the upper pressing mechanism 51A, 51B are lifted and the heat members 75 and the support members 76 of the lower pressing mechanisms 52A, 52B are lowered, the tab lead transferring units 42A, 42B suck and hold rear portions of the tab leads t, t to transfer and supply the tab leads t, t so that the front half portions of the tab leads t, t are adjust to the front face of the solar cell C. In this way, the rear half portions of the tab leads t, t, whose front half portions are connected to the front face of the prior solar cell C, are disposed on the rear face of the solar cell C and the front half portions of the tab leads t, t are also disposed on the front face of the solar cell C.

Figure 10B:
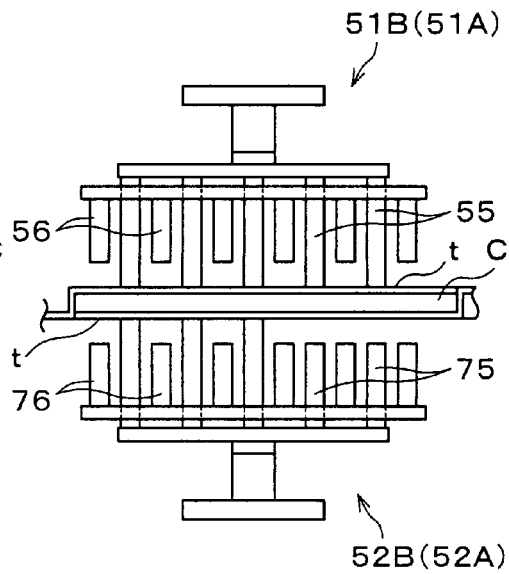

Next, as shown in FIG. 10B, the heat members 55 of the upper pressing mechanisms 51A, 51B are lowered to lower the ends of the eat members 55 to the contact position and the heat members 75 of the lower pressing mechanisms 52A, 52B are lifted to lift the ends of the heat members 75 to the contact position. With this, the front half portions of the tab leads t, t supplied on the front face of the solar cell C are heated as being pressed toward the front face of the solar cell C by the heat members 55 and the front half portions of the tab leads t, t are soldered to the front face of the solar cell C. Further, the rear half portions of the tab leads t, t, whose front half portions are connected to the front face of the prior solar cell C, are heated as being pressed toward the rear face of the solar cell C by the heat members 75 and the rear half portions of the tab leads t, t are soldered to the rear face of the solar cell C.

Figure 10C:
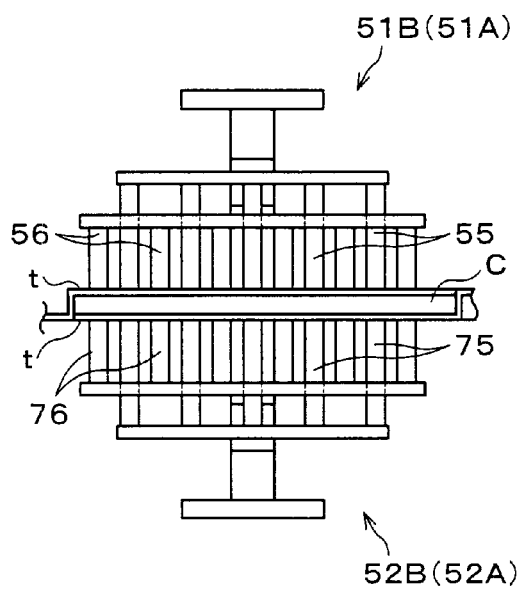

As shown in FIG. 10C, while the tab leads t, t on the front and rear faces of the solar cell C are kept pressed by the heat members 55 and the heat members 75, the support members 56 of the upper pressing mechanisms 51A, 51B are lowered to lower the ends of the support members 56 to the contact position and the support members 76 of the lower pressing mechanisms 52A, 52B are lifted to lift the ends of the support members 76 to the contact position. That is, the tab leads t, t are pressed toward the front and rear faces of the solar cell C by the support members 56 together with the heat members 55 and by the support members 76 together with the heat members 75. Accordingly, the tab leads t, t are surely soldered to the front and rear faces of the solar cell C and the prior solar cell C and the following solar cell C are connected by the two tab leads t, t.

Figure 10D:
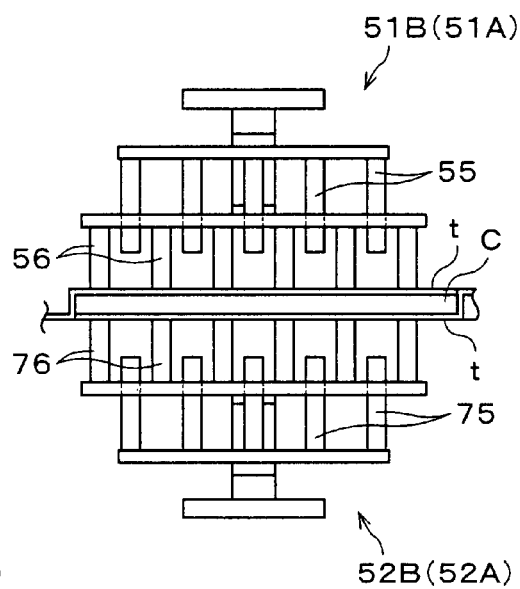

As shown in FIG. 10D, the heat members 55 of the upper pressing mechanisms 51A, 51B are lifted and the heat members 75 of the lower pressing mechanisms 52A, 52B are lowered to move the ends of the heat members 55 and the ends of the heat members 75 to the separation positions to separate from the tab leads t, t. When the ends of the heat members 55 and the ends of the heat members 75 are separated from the tab leads t, t, the support members 56 and the support members 76 are kept contacting with the tab leads t, t. Since the heat members 55 and the heat members 75 are separated from the tab leads t, t, as pressing the tab leads t, t with the support members 56 and the support members 76, it is possible to prevent that the tab leads t, t are pulled by the heat members 55 and the heat members 75. Accordingly, positional displacements of tab leads t, t or soldering failure can be prevented.

As described above, after the tab leads t, t are surely soldered to the front and rear face of the solar cell C the support members 56 of the upper pressing mechanisms 51A, 51B are lifted and the support members 76 of the lower pressing mechanisms 52A, 52B are lowered to move the ends of the support members 56 and the ends of the support members 76 to the separation positions to separate from the tab leads t, t.

After twelve solar cells C1 to C12 are connected with the tab leads t, t according to the above described processes, 5 mm width tab leads t', t' are soldered on the front face of the last solar cell C12. Then, a string S is completed.

While connecting the solar cells C as described above, the solar cell C to which the tab leads t, t(t', t') are already soldered are sequentially transferred from the terminal end of the conveyer 10 to the conveyer 90 and passes through the checking unit 95. Then, the checking unit 95 checks whether or not defects such as a fracture or a crack exist.

After passed through the checking unit 95 and transferred to the string transferring unit 18 by the rotation of the conveyer 90, when the string S is determined as a fine string by the checking unit 95, the string inversion mechanism (not shown) takes up the string to inverse. That is, the condition of the string S is changed form a condition that the front face faces upward and the rear face faces downward to a condition that the rear face faces upward and the front face faces downward. Then, the string S is disposed on the inverted string mounting table 93. The transfer mechanism 98 transfers the string S from the inverted string mounting table 93 to the string container 97. On the other hand, when a defect is found in the checking unit 95, transfer mechanism 98 transfers the string S from the conveyer 90 to the defective string collecting tray 96.

Here, the string container 97 containing a plurality of strings S is carried to a matrix production device by a carrying means (not shown). In the matrix production device (not shown), the string S is taken out from the string container 97 and disposed in parallel in the condition that the rear face faces upward and the front face faces downward. Then, each of the strings S are electrically connected to form a matrix. The completed matrix is placed on a plate-like cover glass in a condition that its rear face faces upward and its front face faces downward. Further, the upper face (rear face) of the matrix is laminated with a protection material (laminate material). With this, a solar cell module is completed.

According to the above described soldering apparatus 1 of the embodiment of the present invention, since the heat members 55 are provided to the upper pressing mechanism 51B and the heat members 75 are provided to the lower pressing mechanism 52B, the tab lead t on the front and rear faces of the solar cell C can be heated in the same condition by the heat members 55, 75 and soldering on the front and rear faces of the solar cell C can be performed in the same condition.

Further, the heat members 75 of the lower pressing mechanism 52B are arranged under the heat members 55 of the upper pressing mechanism 51B and the support members 76 of the lower pressing mechanism 52B are arranged under the support members 56 of the upper pressing mechanism 51B. Accordingly, the front and rear faces of the solar cell C can be surely pressed between the heat members 55 and the heat members 75 and between the support members 56 and the support members 76 so that soldering of tab leads t to the solar cell C can be performed surely and efficiently. Further, the same portions on the front and rear faces of the solar cell C are pressed, fractures of the solar cell C can be prevented.

Figure 11:
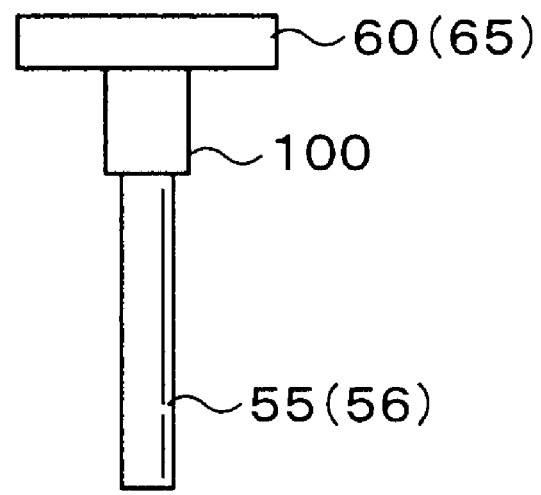
FIG. 11 is an explanatory view showing an embodiment in which a resilient member is provided between a support member and the lifting and lowering plate.

It is noted that, although an example of preferred embodiments of the present invention is described, the present invention should not be limited to the above described embodiment and can be implemented with modifications. For example, as shown in FIG. 11, in the upper pressing mechanisms 51A, 51B, a resilient member 100 made of a spring or rubber can be provided between the heat members 55 and the lifting and lowering plate 60. Similarly, a resilient member 100 made of a spring or rubber can be provided between the support members 56 and the lifting and lowering plate 65. Further, in the lower pressing mechanisms 52A, 52B, also, a resilient member made of a spring or rubber can be provided between the heat members 75 and the lifting and lowering plate 77. Furthermore, a resilient member made of a spring or rubber can be provided between the support members 76 and the lifting and lowering plate 81. (Here, since the upper pressing mechanisms 51A, 51B and the lower pressing mechanisms 52A, 52B have symmetrical structures, the resilient member in the lower pressing mechanisms 52A, 52B are not shown). Such resilient members 100 reduces an impact to the solar cell C when the heat members 55, 75 and the support members 56, 76 are placed to contact with the tab lead t so that fracture generated in the solar cell C can be prevented.

Figure 12:
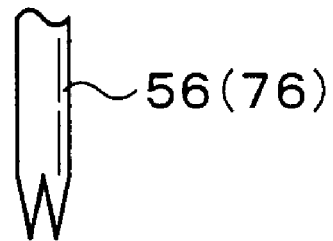
FIG. 12 is an explanatory view showing an embodiment in which an end of the support member is formed in a tapered shape.

Further, as shown in FIG. 12, the ends of the support members 56, 76 can be formed in a tapered shape. When the ends of the support members 56, 76 are formed in such a tapered shape, the contact areas between the support members 56, 76 and the tab leads t can be made small, so that, when the ends of the support members 56, 76 are separated from the tab lead t, the separation can be easily performed.

Further, according to the above described embodiment, the adjacent solar cells C are connected with two tab leads t; however, the adjacent solar cells C can be electronically connected with three (four or more) tab leads t which are arranged in parallel with a predetermined intervals. Or, the adjacent solar cells C can be connected with a single tab lead t.

Figure 13:
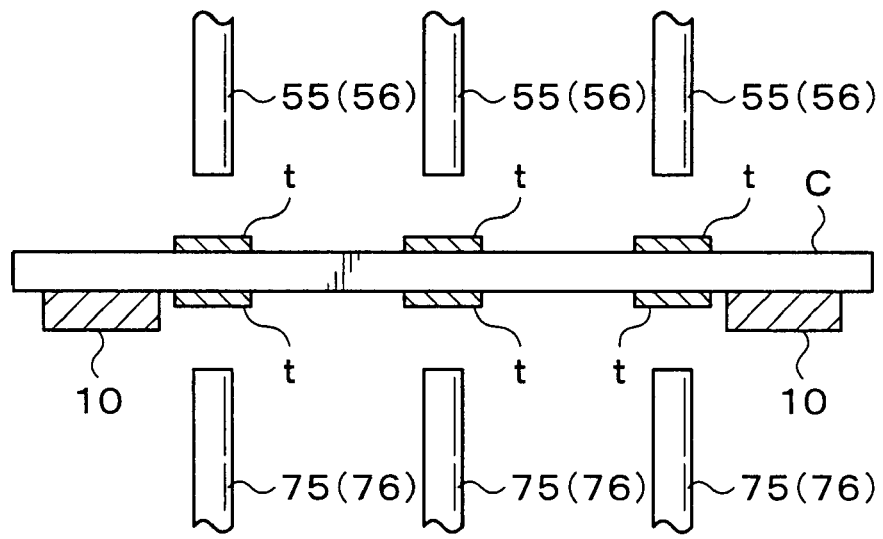
FIG. 13 is an explanatory view showing an embodiment in which a right and left ends of a rear face of the solar cell are placed on a conveyer.
Figure 14:
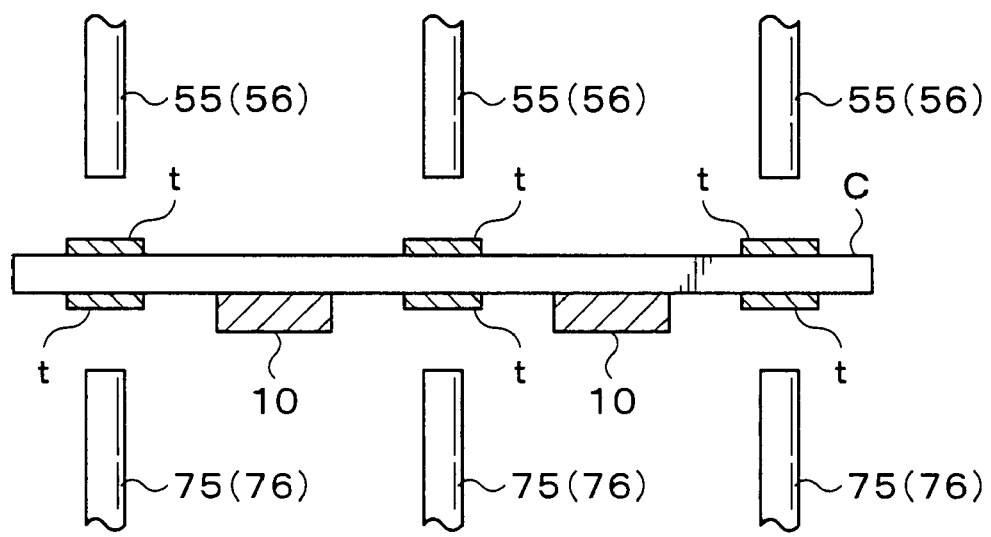
FIG. 14 is an explanatory view showing an embodiment in which inner portions of the rear face of the solar cell between the tab leads are placed on the conveyer.

For example, when adjacent solar cells C are connected with three tab leads t, as shown in FIG. 13, the right side and left side of the rear face of the solar cell C can be placed on the conveyer 10 to carry the solar cells C. Or, as shown in FIG. 14, the portion of the rear face of the solar cells C between the tab leads t can be placed on the conveyer 10 to carry the solar cells C. Here, the same modification can be applied to the conveyer 3.

Further, according to the above described embodiment, 5 mm width tab leads t' in a long tape-like shape are soldered to the rear face electrode of the first solar cell C1 and the front face electrode of the last solar cell C12; however, 2 mm width tab leads t used for connecting adjacent solar cells C can be employed as the tab leads t' to be soldered to the rear face electrode of the first solar cell C1 and the front face electrode of the last solar cell C12. In this case, the 5 mm tab lead feeding units 41A, 41B for supplying 5 mm width tab leads t' can be omitted.

Further, according to the above described embodiment, the cooling mechanisms 54A, 54B for cooling the tab leads t are provided in the outer side of the upper pressing mechanisms 51A, 51; however, the cooling mechanisms 54A, 54B can be omitted. In order provide the same cooling conditions to the front and rear faces of the solar cells C, preferably, those the cooling mechanisms 54A, 54B are omitted or similar cooling mechanisms are provided to the outer side of the lower pressing mechanisms 52A, 52B.

Further, for example, a hot air supply nozzle or an infrared-ray irradiation lamp can be provided in addition to the heat members 55 and the heat members 75. According to the above described embodiment, column-shaped heat members 55, 75 and column-shaped support members 56, 76 are described as an example; however, the shape of the heat members 55, 75 and the support members 56, 76 are not limited to the example.

According to the above described embodiment, the solar cells C are disposed in the container 20 and placed on the conveyers 3, 10, 90 in a condition that its front face faces upward and its rear face faces downward; however, the solar cells C can be disposed in the container 20 and placed on the conveyers 3, 10, 90 in a condition that its front face faces downward and its rear face faces upward.

Further, as illustrated with chained lines in FIGS. 3 and 4, for example, the preliminary heaters 33A, 33B as preheaters for heating the solar cell C can be disposed in downstream of the flux apply mechanisms 30A, 30B. As the preliminary heaters 33A, 33B, preheaters of heating means such as a hot air heater, a lamp heater and an electrical heater. When the preliminary heater 33A, 33B is disposed in this way, the heat-up time for soldering the tab leads t can be reduced and the manufacturing ability can be improved. Here, the location of the preheaters is not limited to the downstream of the flux apply mechanisms 30A, 30B and the preheaters can be provided to other location. Further, the preheaters can be provided to a plurality of places to preheat the solar cells C a plurality of times before soldering the tab leads t, t. When temperature of the solar cells C is gradually raised by a sequential heating by the preheaters, the solar cells C can be gradually heated and a fracture or a deformation of the solar cells C due to the heat stress can be prevented.

Further, a heat-retention heater for heating the solar cells C after soldering the tab leads t, t to the solar cells C can be provided. In this case, a rapid drop in temperature of the solar cells C after soldering can be prevented and heat stress generated to the solar cells C can be reduced. As a heat-retention heater, heating means such as a sheathed heater, hot air heater, a lamp heater and an electrical heater can be applied.

As shown in FIG. 6, a sensor 150 for measuring temperature of the heat members 55, 75 can be provided to each of the heat members 55, 75. As a sensor 150, for example, a K-type thermo couple can be applied. If each of the heat members 55, 75 measures the temperature for soldering the tab leads t, t' with the sensor 150, the soldering of the tab leads t, t' can be confirmed.

The soldering temperature by heat members 55, 75 detected by the sensor 150 can be input to a controller 151 and the controller 151 can control the heating temperature of the heat members 55, 75. In this case, the controller 151 can control so as to provide equal heating temperature from the heat members 55, 75 or different heating temperature from the heat members 55, 75. Further, if the sensor 150 measures temperature of the heat members 55, 75 and the controller 151 controls the heating temperature of the heat members 55, 75, constant soldering can be implemented without receiving influences such as outside air temperature. Further, influence from individual variability of each heater composing the each of the members 55, 75 can be prevented.

What is claimed is:

1. A tab lead soldering apparatus for soldering a tab lead to a front face and a rear face of a solar cell, comprising:
    a first pressing means disposed above the tab lead for pressing the tab lead toward the front face of the solar cell;
    a second pressing means disposed below the tab lead for pressing the tab lead toward the rear face of the solar cell rear face;
    a first heat member and a first support member provided to the first pressing means to contact the tab lead from above the tab lead and a second heat member and a second support member provided to the second pressing means to contact with the tab lead from below the tab lead;
    a heat member shift means for shifting the first and second heat members between a heat member contact position to contact respective ends of the first and second heat members with the tab lead and a heat member separation position to separate the respective ends of the first and second heat members from the tab lead;
    a support member shift means for shifting the first and second support members between a support member contact position to contact respective ends of the support members with the tab lead and a support member separation position to separate the respective ends of the support members from the tab lead;
    a temperature sensor operative for measuring a temperature of the heat member; and
    a controller operative for controlling the temperature of the first and second heat members based on a value measured by the temperature sensor,
    wherein, the first and second heat members and the first and second support members move sequentially from a separation state, to a heat member only contact state, to a heat member support member contact state to a support member only contact state such that:
    in the separation state, the first and second heat members are in the heat member separation position separated from the tab lead and the first and second support members are in the support member separation position separated from the tab lead,
    in the heat member only contact state, the first and second heat members are in the heat member contact position in contact with the tab lead and the first and second support members are in the support member separation position separated from the tab lead,
    in the heat member support member contact state, the first and second heat members are in the heat member contact position in contact with the tab lead and the first and second support members in the support member contact position in contact with the tab lead, and
    in the support member only contact state, the first and second heat members are in the heat member separation position separated from the tab lead and the first and second support members are in the support member contact position in contact with the tab lead.

2. The tab lead soldering apparatus according to claim 1, further comprising
    a cool air supply nozzle supplying cool air to the tab lead.

* * * * *